United States Patent
Ball

(10) Patent No.: US 7,694,208 B2
(45) Date of Patent: Apr. 6, 2010

(54) ERROR CORRECTION ALGORITHM USING INTERLEAVED PARITY CHECK AND REED-SOLOMON CODE

(75) Inventor: Matthew V. Ball, Boulder, CO (US)

(73) Assignee: Quantum Corporation, San Jose, CA (US)

( * ) Notice: Subject to any disclaimer, the term of this patent is extended or adjusted under 35 U.S.C. 154(b) by 929 days.

(21) Appl. No.: 11/313,438

(22) Filed: Dec. 20, 2005

(65) Prior Publication Data

US 2007/0143659 A1    Jun. 21, 2007

(51) Int. Cl.
H03M 13/00    (2006.01)

(52) U.S. Cl. .................. 714/784; 714/758; 714/756

(58) Field of Classification Search .............. 714/752, 714/756, 758, 784

See application file for complete search history.

(56) References Cited

U.S. PATENT DOCUMENTS

| | | | |
|---|---|---|---|
| 4,907,215 A * | 3/1990 | Sako et al. .......... | 369/59.25 |
| 5,136,592 A | 8/1992 | Weng | |
| 5,606,569 A * | 2/1997 | MacDonald et al. ..... | 714/758 |
| 5,671,237 A * | 9/1997 | Zook .................. | 714/755 |
| 6,041,431 A * | 3/2000 | Goldstein ............. | 714/784 |
| 7,076,723 B2 | 7/2006 | Saliba | |
| 7,162,678 B2 | 1/2007 | Saliba | |
| 7,406,651 B2 * | 7/2008 | Yoon ................... | 714/784 |
| 7,421,642 B2 * | 9/2008 | Williamson et al. ..... | 714/785 |

2005/0188293 A1    8/2005  Ball et al.

FOREIGN PATENT DOCUMENTS

| | | |
|---|---|---|
| EP | 0 905 911 A2 | 3/1999 |
| EP | 0 905 911 A3 | 3/1999 |
| EP | 1 458 107 A1 | 9/2004 |
| EP | 1 523 100 A1 | 4/2005 |

OTHER PUBLICATIONS

European Search Report mailed Mar. 21, 2007 for European Application No. 06256490, three pages.
Xu, Y. et al. (Sep. 2002). "Variable Shortened-and-Punctured Reed-Solomon Codes for Packet Loss Protection," *IEEE Transactions on Broadcasting* 48(3):237-245.
Zongwang, L. et al. (Mar. 2003). "Design and Implementation of a Novel Algorithm for Iterative Decoding of Product Codes," *High Technology Letters* 9(1):35-40.

* cited by examiner

*Primary Examiner*—Esaw T Abraham

(57) ABSTRACT

Methods and apparatuses for correcting errors in a data stream are described herein. In one aspect, the error correction process is operable to correct errors in at least two separate types of data streams, each of which utilizes a distinct error correction scheme. The error correction process utilizes Reed-Solomon code and Error Detection Code (EDC) in combination for error correction. The process comprises using a Reed-Solomon code to identify errors in a plurality of data blocks and attempting to correct the errors. An EDC map is then generated, wherein the EDC map identifies the location of the errors within the corresponding data blocks which includes errors that are not corrected by the Reed-Solomon code.

30 Claims, 13 Drawing Sheets

| Codeword | Corrected Block # |
|---|---|
| B | 7 |
| C | 4 |
| D | 5 |
| E | 8 |
| F | 2 |
| G | 6 |

ERROR CORRECTION ALGORITHM USING INTERLEAVED PARITY CHECK AND REED-SOLOMON CODE

FIELD OF THE INVENTION

The invention is related generally to the field of error correction code. In one aspect of the invention, the apparatuses and methods disclosed herein can be implemented in a magnetic tape drive.

BACKGROUND

As density of data stored on the data storage mediums increases, more sophisticated error correction methods are needed to verify the integrity of the data stored on the medium and correct errors that can arise during writing and/or reading process. In addition, as the data storage device becomes smaller and operates at a faster speed, error rate also increases when reading data from the data storage medium.

For example, when an improved tape drive with smaller readers is utilized to read older generations of magnetic tape, error rate can be significantly higher due to the smaller reader dimension and/or faster operation speed. In addition, the older generations of tapes may utilize error correction codes which are more primitive than the newer generations of tapes. As a result, the new generations of tape drive may not be backwards compatible with older generations of tapes.

Therefore, there is need for an error correction process that implements new generations of error correction code, while at the same time is able to take advantage of older generations of error correction code, such that data that are saved in the older formats can be retrieved and utilized by the new generation of systems.

SUMMARY OF THE INVENTION

Methods and apparatuses for correcting errors in a data stream are described herein. In one aspect, the error correction device is operable to correct errors in at least two separate types of data streams, each of which uses a distinct error correction scheme. In one example, the error correction device is operable to receive a stream of encoded data, which includes a plurality error detection codes (EDCs), the error correction device comprises a decoder operable to use the plurality of EDCs to detect errors in a first dimension of a two dimensional data array configured from the stream of encoded data, and use a Reed-Solomon code to correct codewords in a second dimension of the two dimensional data array. The controller is further operable to map codewords from the Reed-Solomon code to corresponding bits within one or more of the EDCs. In one variation, the symbol size of the Reed-Solomon code is smaller than that of at least one of the EDCs. In another variation, the error correction device is configured as a part of a controller. The controller is coupled to a transducer for detecting data recorded on a data storage medium. In one particular application, the transducer comprises a magnetic tape drive head (e.g., magneto-resistive tape head), and the data storage medium comprises a magnetic tape. In other applications, the error correction device can be configured to process data read from an optical disk, a magnetic disk, or an optical tape.

In one implementation, the decoder is operable to generate an EDC map to correlate the codewords from the Reed-Solomon code to EDC residuals, wherein the EDC map consists of binary ones for the bits within the EDC residual that might be affected by a changing symbol within the Reed-Solomon codeword, and binary zeros in all the other bits. The EDC map is normalized by performing a cyclic bit-rotation or other mapping operations, such that the bits within a bit-mask directly maps to corresponding bits within the EDC residual. In one variation, two or more EDC maps are generated and a bit-wise logical OR of all the EDC maps is used for determining the bits of the EDC residual affected by all the notable Reed-Solomon codewords. In another variation, two or more EDC maps are generated and bit-wise logical AND and OR operations are used within the EDC maps to determine whether two or more Reed-Solomon codewords could affect the same bits within the EDC residual.

In some variations, at least one of the EDCs is described by a primitive polynomial having a form $g(x)=x^n+1$, where n is the number of bits within an EDC symbol. The generator polynomial of the EDC can take the form $G(X)=X+\alpha^s$, wherein $\alpha$ is a root of the primitive polynomial and s is any integer between 0 and n−1.

In another aspect, methods for error correction using Reed-Solomon code and EDC are described. In one example, the method comprises using a Reed-Solomon code to identify errors in a plurality of data blocks and attempt to correct the errors, using cyclic redundancy check to determining whether there are errors in any of the data blocks, and using an error detection code (EDC) in each data block to correct errors in the data block which are not corrected by the Reed-Solomon code. To use EDC in each data block to correct errors, an EDC map is generated, wherein the EDC map identifies the location of the errors within the corresponding data blocks which includes errors that are not corrected by the Reed-Solomon code.

In one variation, the EDC map is generated by creating a set of EDC maps for each notable Reed-Solomon codeword, the EDC map consisting of binary ones for the bits within the EDC residual that might be affected by a changing symbol within the Reed-Solomon codeword, and binary zeros in all the other bits. The EDC map is then normalized by performing a mapping operation, such that the bits within the bit-mask directly map to corresponding bits within the EDC residual. In one example, the mapping operation comprises a cyclic bit-rotation.

These and other embodiments, features and advantages of the present invention will become more apparent to those skilled in the art when taken with reference to the following more detailed description of the invention in conjunction with the accompanying drawings that are first briefly described.

DETAILED DESCRIPTION OF THE INVENTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

A magnetic tape drive is used herein as an example application for using the error correction methods and apparatuses disclosed herein, in order to illustrate the various aspects of the invention. In light of the disclosure herein, one of ordinary skill in the art would appreciate that the methods and apparatuses disclosed herein can be implemented in various memory storage components or data transferring apparatuses that uses error correction code (ECC) to ensure the integrity of data retrieved from a data storage medium. For example, the methods and apparatuses disclosed herein can also be implemented in various other data storage systems (e.g., hard drives, optical drives, etc.) to provide data verification and protection. In another example, network routers that implement ECC in the data buffering process may also take the advantage of the methods and apparatuses disclosed herein to achieve efficient ECC utilization. In yet another example, the methods and apparatuses disclosed herein could be used in the memory controller for checking and correcting data retrieved from storage medium. The methods and apparatuses may also be configured to provide backwards compatibility such that two or more data encoding formats are supported by the data storage system.

It must also be noted that, as used in this specification and the appended claims, the singular forms "a," "an" and "the" include plural referents unless the context clearly dictates otherwise. Thus, for example, the term "a transducer" is intended to mean a single transducer or a combination of transducers, "an electrical signal" is intended to mean one or more electrical signals, or a modulation thereof. In addition, EDC as used herein includes, but not limited to, EDC residual, redundancy block, parity block, and variations of error detection code that are well known to one of ordinary skill in the art, and improvements thereof. Reed-Solomon code as used herein includes, standard Reed-Solomon code, variations of Read-Solomon code that are well known to one of ordinary skill in the art, and improvements thereof.

Figure 1:
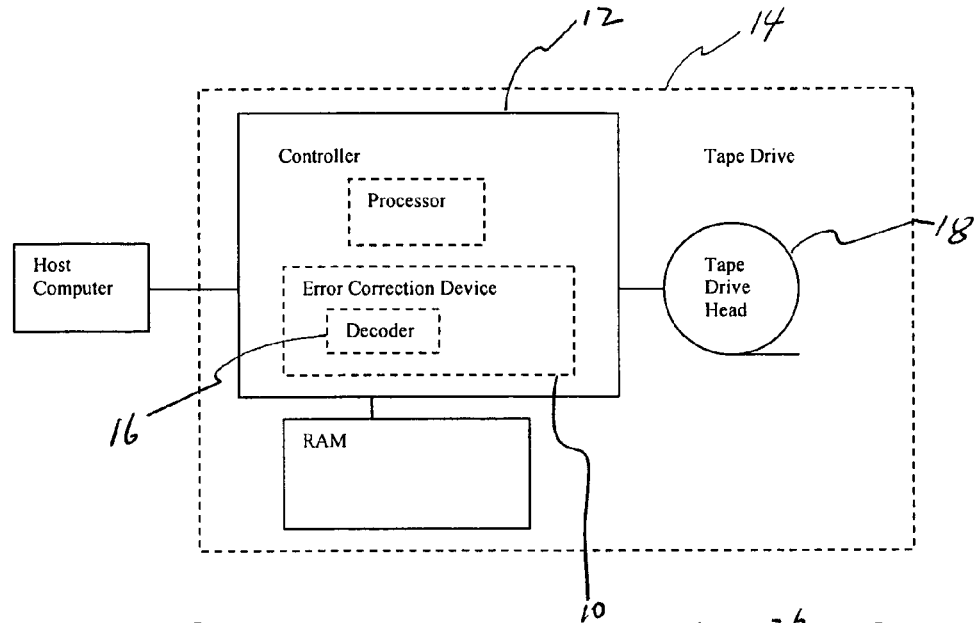
FIG. 1 illustrates one implementation of an error detection device where the error detection device is part of the controller for a magnetic tape drive.

Referring to FIG. 1, in one application, the error correction device 10 is implemented as part of a controller 12 within a magnetic tape drive 14 for correcting errors in the data stream read from a magnetic tape. The error correction device comprises a decoder operable to execute an error correction algorithm. The magnetic tape drive head 18 is operable to read data on a magnetic tape, wherein the data comprises a plurality of data blocks. The controller is electrically connected to the magnetic tape drive head 18, the controller is operable to use an error correction code (ECC) field in each of data block to correct errors in the data. In one configuration, the controller is also operable to use a cyclic redundancy check (CRC) field in each of the data block to check for errors in each of the data blocks.

In one variation, the error correction device is configured to decode data saved in two separate formats (e.g., two magnetic data storage tapes, one is written with an encoding scheme that comprises ECC field, and the other is written with an encoding scheme that comprises CRC field), wherein the data blocks either have an ECC field or a CRC field, and the ECC field and the CRC field occupies the same locations in the data blocks. The controller is further operable to use an EDC field to correct errors in the data block. In one variation, the controller is operable to generate a map based on the EDC field in each data block, the map is configured for use by the controller to identify the location of errors in the corresponding data block. In one example, the controller is operable to use a Reed-Solomon code to correct errors in the plurality of data blocks, and also generates an EDC map to correlate codewords from the Reed-Solomon code to EDC residuals. In one implementation, the EDC map consists of binary ones for the bits within the EDC residual that might be affected by a changing symbol within the Reed-Solomon codeword, and binary zeros in all the other bits.

An exemplary error correction process is illustrated below. In this example, the error correction process is implemented in the controller of the tape drive. A more powerful form of error correction process (i.e., two-dimensional Reed-Solomon code) is used, which allows the tape drive to operate at a higher performance point in comparison to many of the traditional tape drives, while allowing media with a higher bit error rate. This error correction process also allows for reading of tapes written in previous formats, such as ones encoded with CRC, while using the smaller reader than the older generation of tape drive.

The ECC used in this example, is a two-dimensional code, also called a product code. The first dimension is a block, which uses either a 64-bit CRC or a 16-bit Reed-Solomon code for error detection or error correction. The second dimension is an entity, which contains a group of Data and ECC blocks. When writing data to tape, the tape drive uses a structure called an envelope, whose purpose is to interleave entities across all the channels, thus minimizing exposure to marginal channels. When the tape drive receives a stream of data from the host, the memory controller in the tape drive places this data into basic units called data blocks. The ECC engine in the decoder then produces ECC blocks that help reconstruct any corrupted or missing data blocks.

Figure 2:
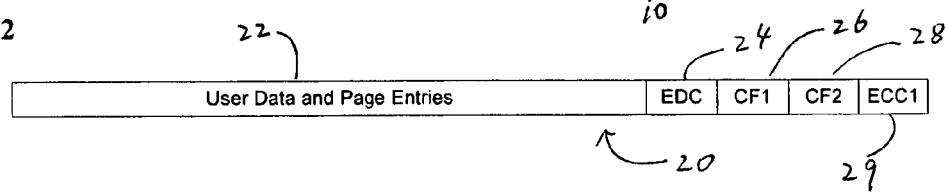
FIG. 2 shows an example of a Data Block layout for a tape drive.
Figure 3:
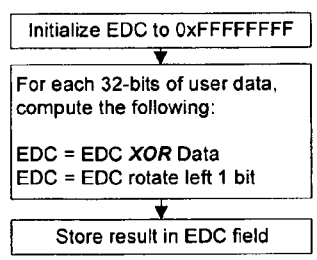
FIG. 3 illustrates an algorithm to compute the EDC.

The Data Blocks contain user data along with various control fields. An overview of the block layout 20 for this exemplary tape drive is shown in FIG. 2. The tape drive creates the User Data 22 section of each data block using information it receives from the host. Following the User Data section is the EDC (Error Detection Code) field 24. This is a 32-bit field that contains a checksum of the preceding User Data region. The correction algorithms use the EDC for correction verification, and may also be used to correct the block data itself. The algorithm 30 used by the drive to compute the EDC is illustrated in FIG. 3. Verifying the EDC is a matter of performing the same algorithm, but continuing through the EDC field. This creates a residual. If the residual is zero, then the EDC check was successful. If the residual is non-zero, then some part of the block contains a corruption.

Figure 4:
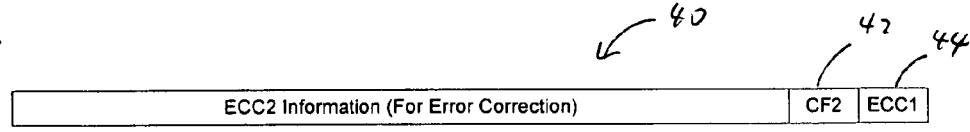
FIG. 4 shows an example of an ECC Block Layout.

The CF1 (Control Field 1) 26 is 16 bytes long and contains information that can be used to logically identify this block. The CF2 (Control Field 2) 28 contains information that can be used to identify its physical location on tape and within the error correction structures. This is a 64-byte field that contains redundancy information used to correct defects within this block. The hardware appends this data to a block as it goes out to tape. During a read operation, the correction hardware strips off these bytes after using them to correct the block. The ECC1 hardware is capable of correcting up to 16 corrupt symbols within the block. In this case, each symbol is 16-bits wide. The ECC2 hardware (called the REC) takes a set of data blocks, and generates redundancy information. The REC hardware is described in detail in US Patent Application Publication No. 2005/0188293 A1, published Aug. 25, 2005, entitled "Error Correction Decoder Using Cells with Partial Syndrome Generation" which is incorporated herein by reference in its entirety for all purposes. This newly created block is an ECC block 40, and its sole purpose is to help correct any corrupted data blocks. The format is illustrated in FIG. 4. The CF2 42 and ECC1 44 fields for an ECC2 block are the same as those for a data block.

Figure 5:
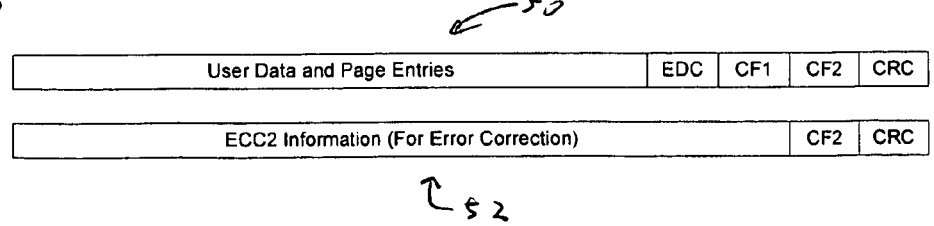
FIG. 5 shows the Data and ECC Block Layout for BRC (Backwards-Read Compatibility) formats.

In this example, the block layout for all the back-read formats is essentially the same as that of the Quantum DLT-S4 tape drive's native format, with the exception that a 64-bit CRC replaces the ECC1 field 29. The CRC is only able to perform error detection and has no correction ability. The layout for both the Data 50 and ECC 52 block for older formats which are also supported by the exemplary error correction process in this tape drive is shown in FIG. 5.

Figure 6:
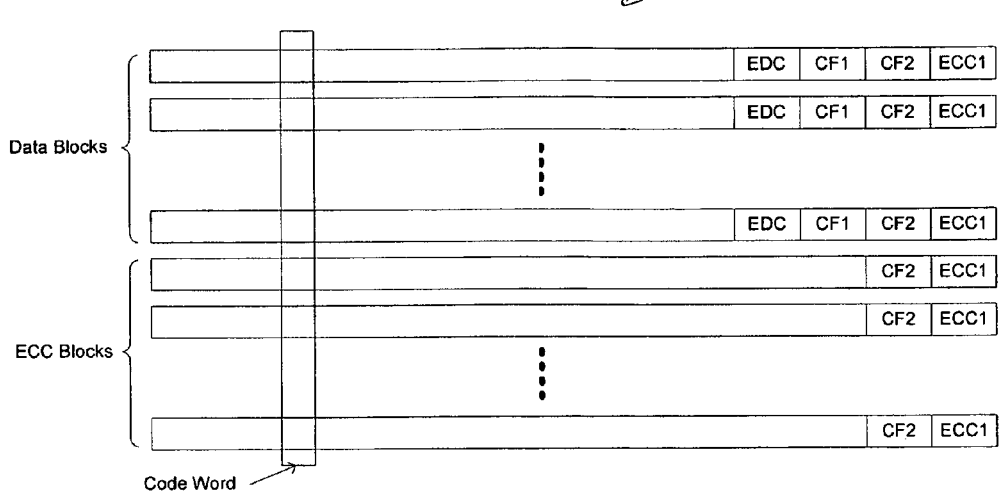
FIG. 6 shows an example of an Entity Layout.

The Quantum DLT-S4's ECC2 algorithm protects against whole-block errors by using a structure called an entity. An entity is a collection of between 1 and 112 Data blocks, along with 16 ECC blocks, used to reconstruct corrupted data blocks. The layout for an entity 60 is illustrated in FIG. 6. Notice the vertical rectangle with the label "Codeword". Each entity contains 12,288 of these codewords, which span from the left-most side, all the way to the end of CF1. The CF2 field and CRC (or ECC1) fields are not included. Each codeword contains one symbol (which is a byte in this context) from each block within the entity. In this example, the codeword is the collection of the symbols at the same offset within all the blocks. The ECC2 algorithm independently processes codewords when performing a correction operation.

Figure 7:
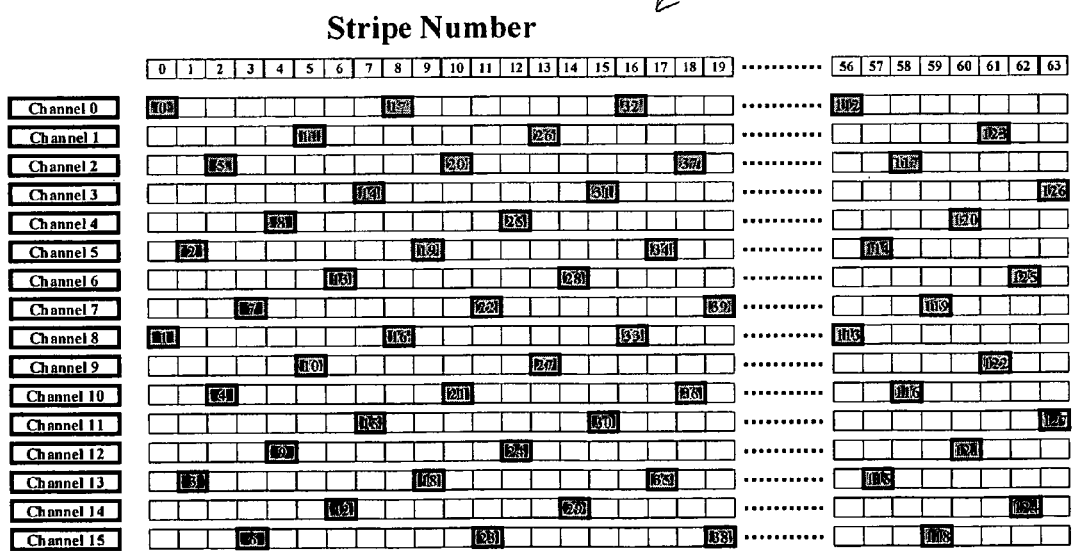
FIG. 7 shows an example of an Envelope Layout

Previous formats, implemented in some of the tape drives in the market (e.g., Quantum SDLT320, Quantum SDLT600), use the same basic entity layout, except they have fewer blocks. Particularly, a Back-Read Compatibility (BRC) format that contains between 1 and 16 data blocks, and 4 ECC blocks. This relative block layout on tape is described below. When writing data, this tape drive uses a basic unit called an Envelope. An envelope contains 1 to 8 entities interleaved across all channels in a scatter pattern. The tape drive writes an envelope in stripe increments. A stripe is the vertical grouping of blocks written at the same time by all channels. An example layout for an envelope 72 as written with this exemplary drive on the magnetic tape is illustrated in FIG. 7. Each rectangle represents a block on tape. The shaded rectangles show the scatter pattern for the first entity. Each of the other 7 entities have the same pattern, but with a different starting point. A nominal envelope holds 8 entities and spans 64 stripes.

Figure 8:
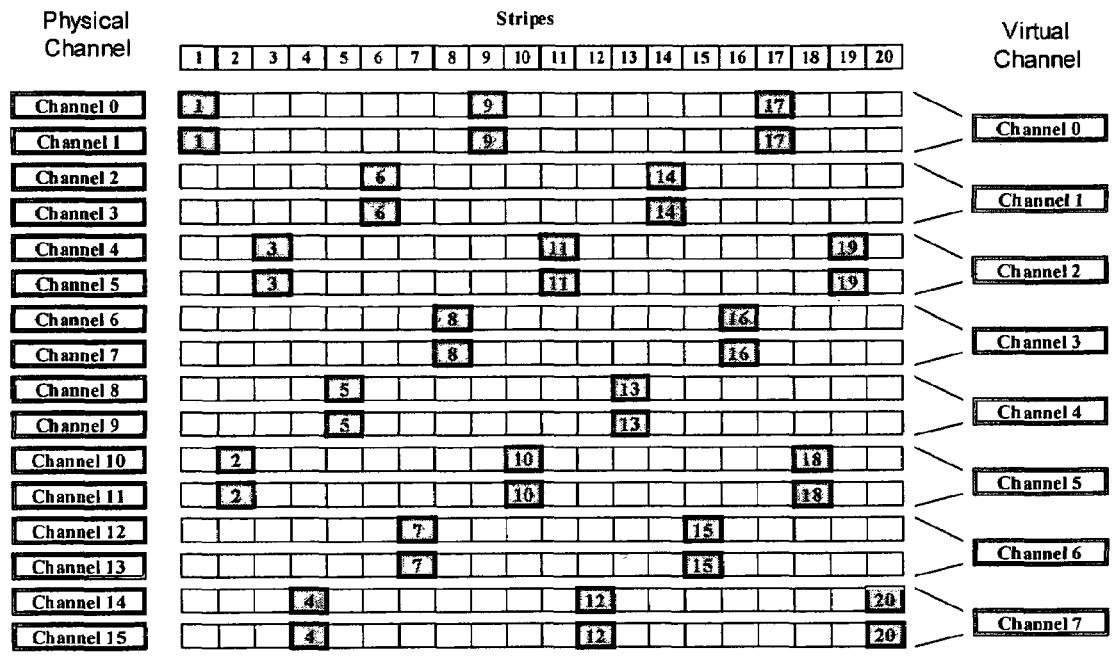
FIG. 8 shows an exemplary Envelope Layout for one of the backward compatible formats.
Figure 9:
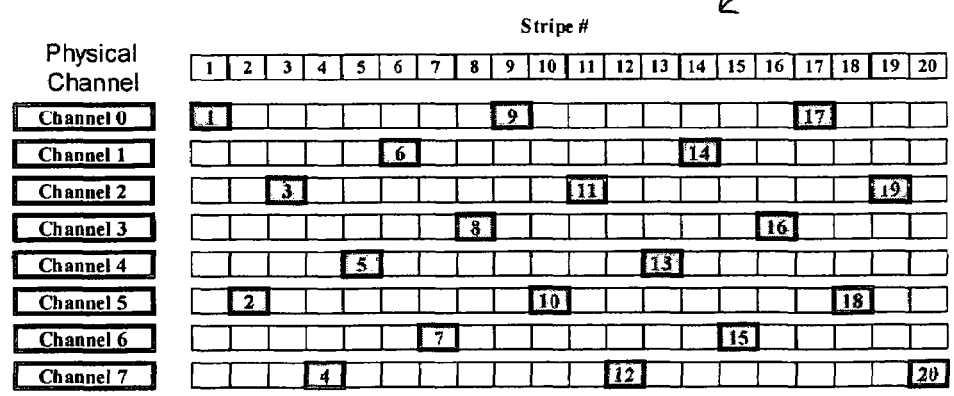
FIG. 9 shows another Envelope Layout that is a backward compatible format.

An example of an envelope layout 82 for an older format is shown in FIG. 8. This example illustrates a format utilized in the Quantum SDLT600 tape drive. This particular format uses the concept of coupled channels, which is a simple way to double the number of physical channels on tape, while keeping the number of logical channels the same as previous products. Each envelope contains 8 entities, and a full sized entity contains 20 blocks (16 data and 4 ECC). Another format (i.e., Quantum SDLT 220/320) supported by this exemplary tape drive is shown in FIG. 9. The SDLT220/320 format is published as an ECMA specification (ECMA-320). In FIG. 9, each of the envelopes 92 nominally contains twenty stripes and eight entities.

Figure 10:
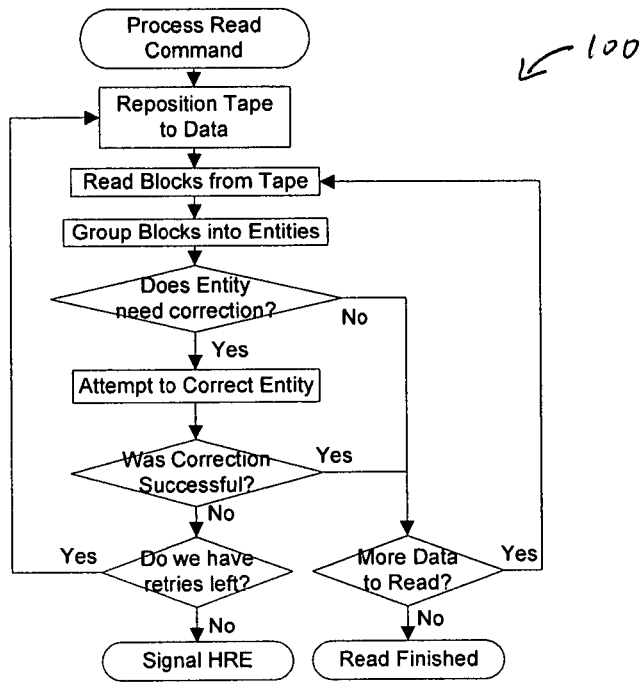
FIG. 10 illustrates an example of a read algorithm.
Figure 11:
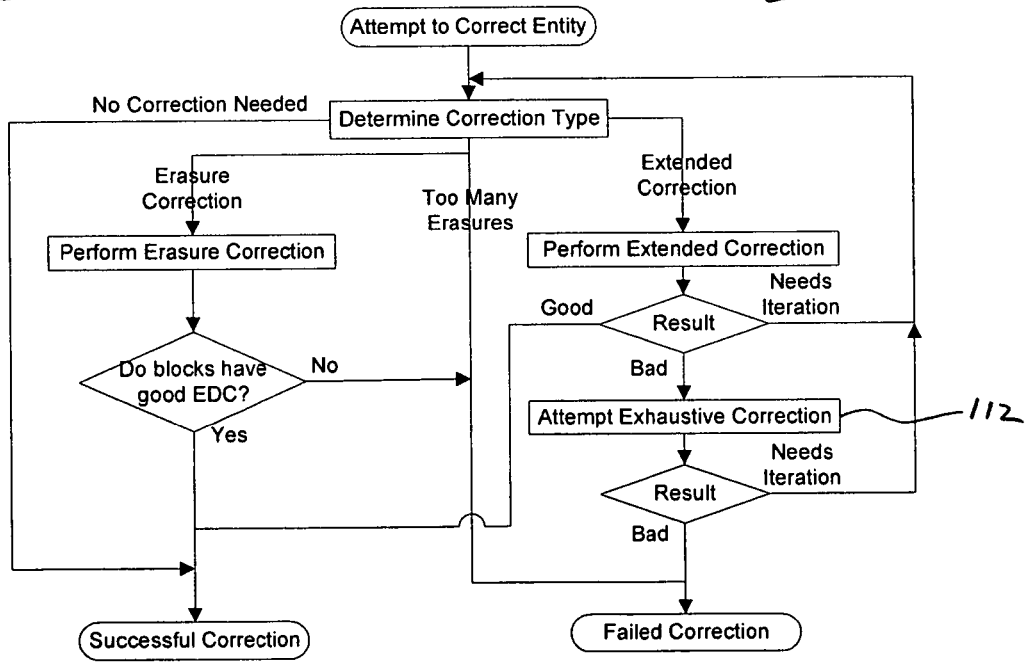
FIG. 11 illustrates the overall correction process.

The error correction process is a sub-set of the read process. A flowchart showing the read process 100 is illustrated in FIG. 10. The drive reads some data. If the data is bad, the drive attempts to correct it. If the correction fails, then the drive repositions the head, and attempts to read the data again. If this happens too many times, then the drive gives up and signals a Hard Read Error (HRE). A diagram illustrating the overview of the correction process 110 is provided in FIG. 11.

The correction process chooses from three basic algorithms: Erasure Correction, Extended Correction, and Exhaustive Correction. Both Extended and Exhaustive Correction have the ability to perform another 'iteration'. This is true in cases where the correction algorithm recovered some of the data, but needs to attempt another correction to get the remaining data.

Figure 12:
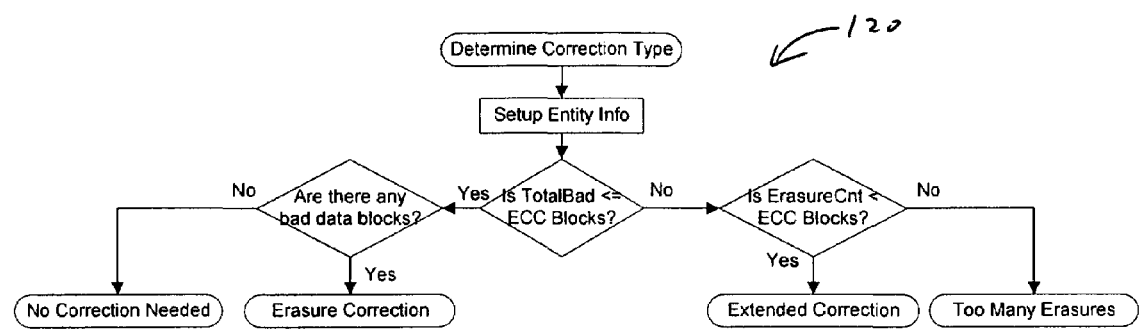
FIG. 12 illustrates a process for Determine Correction Type.

The first step of the correction process is to "Determine Correction Type" 120. FIG. 12 outlines this process. This algorithm starts by examining the entity in question and determines the number of missing blocks (erasures), the number of partially recovered blocks (Bad ECC1 or CRC, but otherwise good), and the number of good blocks. The quantity TotalBad is the sum of the erased blocks and the partially recovered blocks (i.e. anything that's not good). When TotalBad is less than or equal to the maximum number of ECC blocks from this format, then the device can use the optimized Entity Erasure Correction. As a special case, the device double-checks that there is at least one bad data block. If not, there is no need to perform a correction. When TotalBad is more than the maximum number of ECC blocks, the device needs to use the Extended Correction algorithm. This is only possible if the number of erased (i.e. completely missing) blocks (ErasureCnt) is less than the maximum number of ECC blocks. In one implementation, if there are too many erasures, the device stops the correction process because correction can not be performed successfully.

The most basic of all the correction algorithms is the Entity Erasure Correction algorithm. This algorithm can be effective if there are at most 16 corrupt blocks (or at most 4 for some of the earlier formats that have been implemented in some of the tape drives in the market). In this example, the device has a simple set of linear equations that have no more unknown than known values. The ECC2 hardware assist (REC) can quickly perform a matrix multiply operation to solve these linear equations. The correction process comprises creating a correction matrix, then programming the hardware to use this matrix for correcting the missing data blocks.

Figure 13:
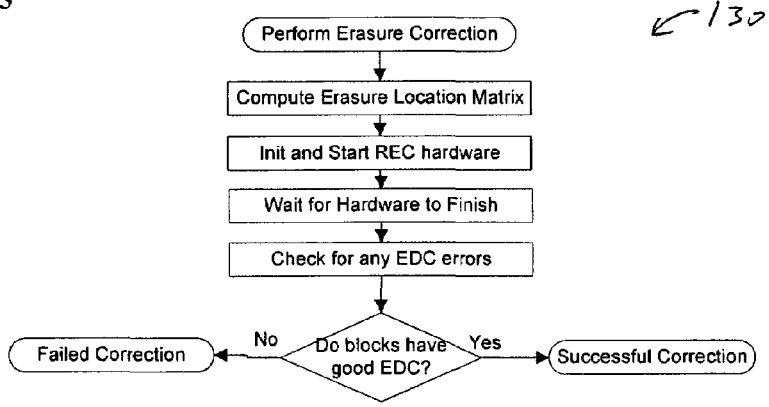
FIG. 13 illustrates an example of the Erasure Correction algorithm.

While performing an erasure correction, the hardware performs an EDC check on all newly created blocks. When the correction is finished, the firmware checks the EDC residual on each newly created data block. If the EDC check indicates that any data block has an error, the Erasure Correction algorithm fails with an error indicating that the entity is not correctable. FIG. 13 is a diagram that illustrates the over-all process for Erasure Correction 130.

Figure 14:
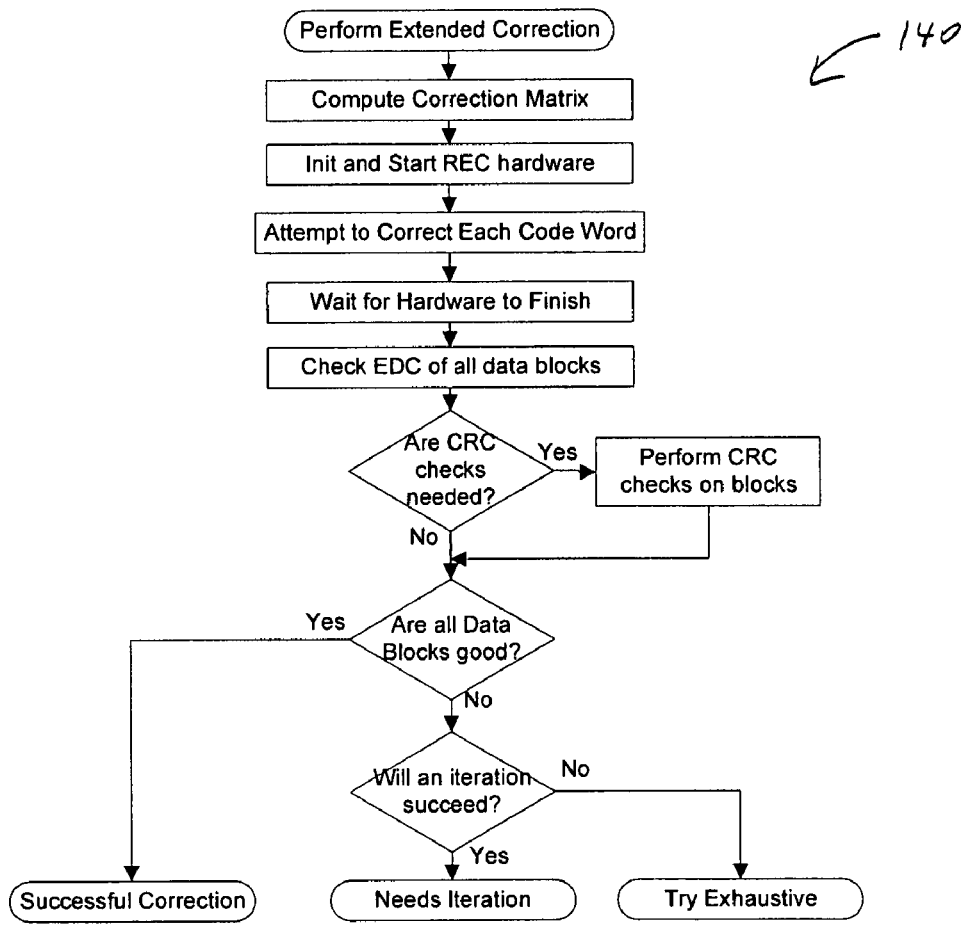
FIG. 14 illustrates an example of the Extended Correction algorithm.

The Extended Correction algorithm (also known as Partial Correction) is capable of correcting entities that contain a relatively large number of partially recovered blocks (those with bad ECC1 or CRC64). This algorithm will succeed if each codeword has fewer errors than half the number of syndromes. In one variation, a standard Reed-Solomon error correction algorithm is implemented to perform the extended correction. In some situations, the Extended Correction algorithm is unable to correct the entity, but it is possible for the Erasure Correction algorithm to finish-up. In this case, Extended Correction returns a result that indicates the device should try another iteration. In yet other cases, it is clear that Extended Correction cannot try another iteration directly. In these cases, the Exhaustive Correction process will be executed. A diagram showing the overall Extended Correction process 140 is provided in FIG. 14.

Figure 15:
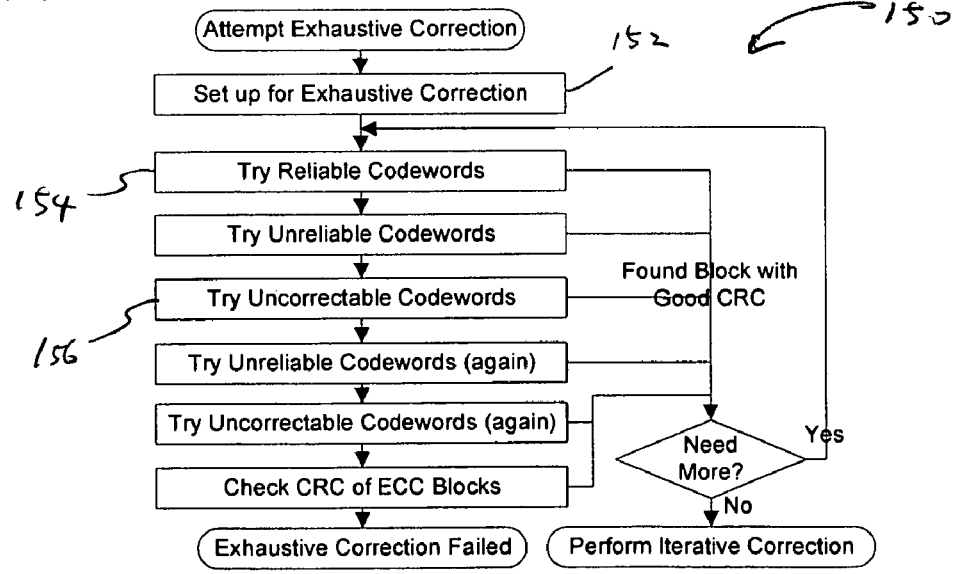
FIG. 15 illustrates an example of the Exhaustive Correction algorithm.

The Exhaustive Correction algorithm attempts to correct an entity by exhaustively attempting correction combinations, then using the CRC64 check to validate the correction. The flow chart of the Exhaustive Correction algorithm 150 is illustrated in FIG. 15. This process corresponds to the box labeled "Attempt Exhaustive Correction" 112 from FIG. 11.

The first box "Set up for Exhaustive Correction" 152 is for any one-time computation needed before starting an Exhaustive Correction attempt. These computations are mainly for performance enhancements. The last box is a final check to see whether the other algorithms fixed any ECC blocks.

Overall, the process is to attempt a particular algorithm and check for any good CRC results. If there is a good CRC check, then either perform an iterative correction (if there are enough good CRC checks), or restart the algorithm at the beginning to try to generate more good CRC checks. If none of the algorithms can generate any good CRC checks, then the Exhaustive Correction algorithm fails. After a failure, the device needs to perform a reposition retry, or report a hard read error (HRE).

Figure 16:
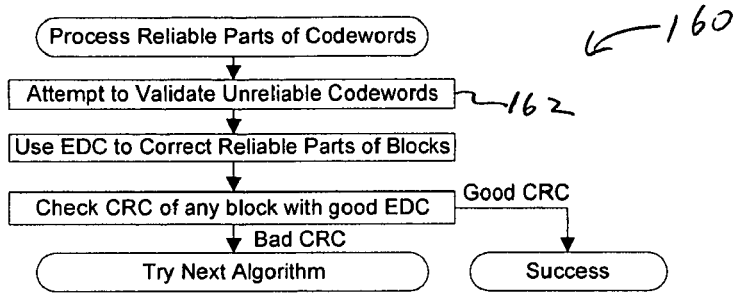
FIG. 16 illustrates an example of the algorithm to process reliable parts of the codewords.

The second box 154 from FIG. 15 is for an algorithm that attempts to correct any reliable codewords. Overall, this algorithm uses the EDC to correct the codewords without any EDC collisions. This algorithm 160 involves the steps outlined in FIG. 16. The first step 162 of this algorithm is to go through the list of unreliable codewords, and mark them as good if the device successfully validated the CRC of any corrected block. This step is promoting unreliable codewords to reliable codewords if it looks like any part of the correction produced a valid block. There is still a possibility that this codeword could be incorrect, but that probability is sufficiently lower than the target uncorrectable error rate. After promoting any unreliable codewords in the previous step, the device next uses the EDC residual in each block to correct any reliable regions. A reliable region is the part of a 32-bit word that does not have a collision with any other unreliable or uncorrectable codewords. In these cases, the device has a reliable one-to-one mapping of a bad codeword and a region within the EDC residual. The device can apply these changes without worrying about having to keep undo information.

This algorithm examines each codeword and determines whether it has no collision, a partial collision, or a complete collision. In the case of no collisions, the device can entirely correct this codeword and mark it as good. If there is a partial collision, the device can correct the region with no collision, but will leave the other bits alone. The device will keep this codeword around as an uncorrectable codeword. If there is a complete collision, then the device skips the codeword entirely. With this algorithm, any unreliable codewords become uncorrectable codewords if the device finds any non-zero EDC bits that don't have collisions. In this case, the device assumes that this is a miscorrection, and undoes the previous correction.

Figure 17:
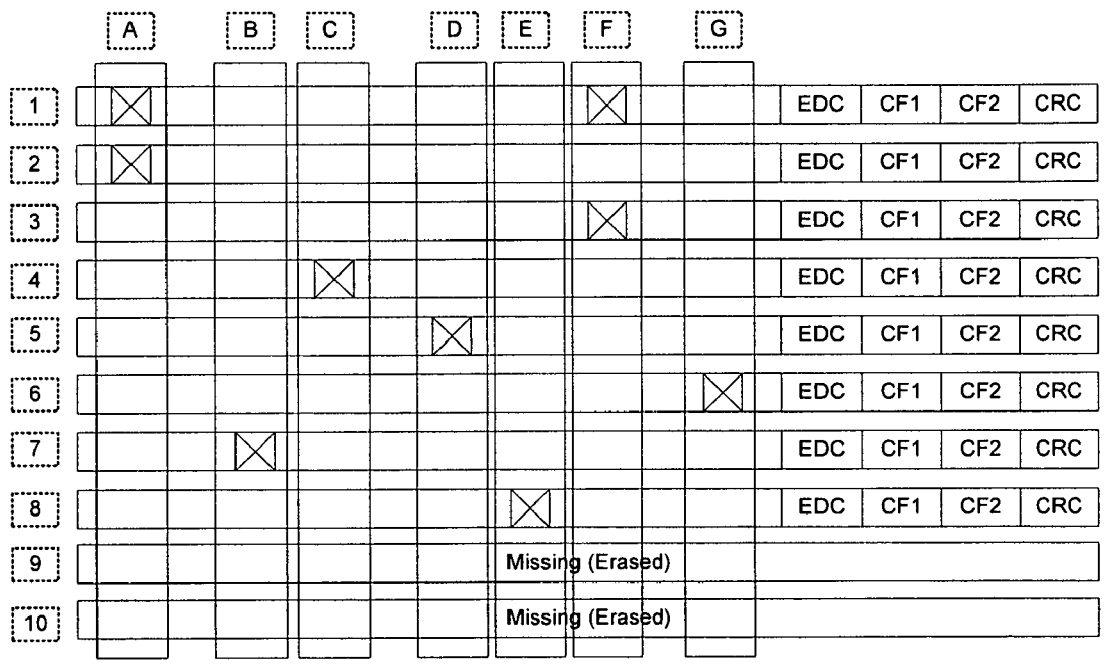
FIG. 17 shows an example of the setup for EDC Correction.

An example illustrating how processing the reliable parts of codewords can produce a successful correction is described below. This example shows the processing of data written in an existing tape drive format (i.e., Quantum tape drive Chipotle (SDLT320) format). As shown in FIG. 17 the example entity 170 has two erased (completely missing) blocks 9 and 10. Blocks 1 through 8 have bad CRC because of at least one corrupted byte. The other 10 blocks all have good CRC, and do not participate in the correction except for the syndrome generation.

Figures 18, 19:
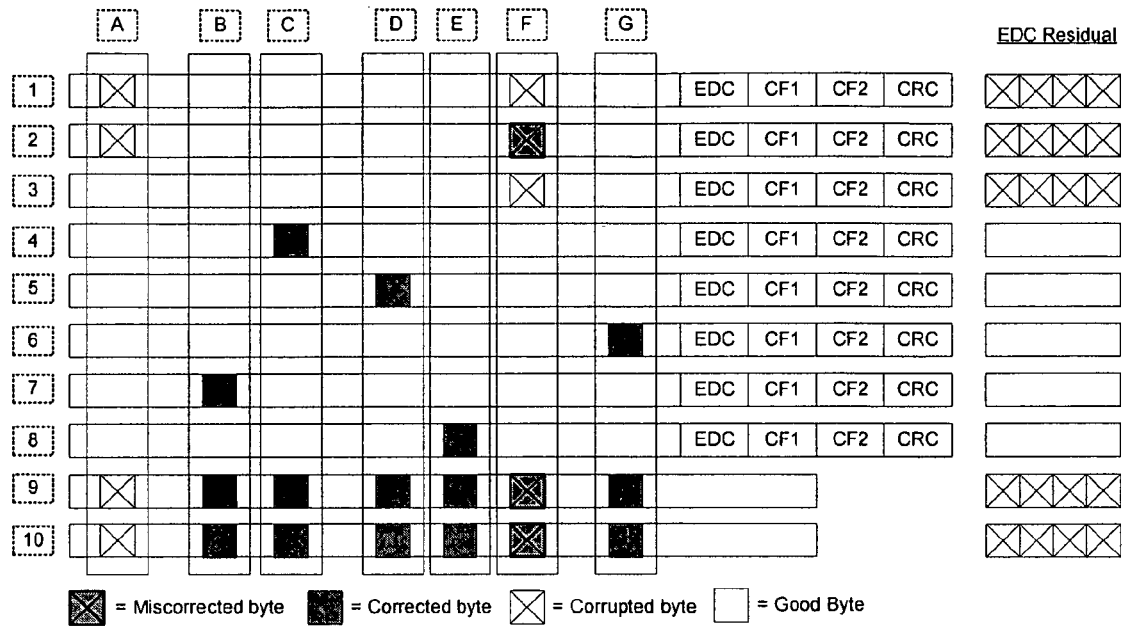
FIG. 18 shows the result of Extended Correction.
FIG. 19 is a table illustrating an unreliable Codeword Map

In this example, the Extended Correction algorithm identified 7 corrupted codewords, labeled A through F in the above figure. Codewords B, C, D, E, and G all have only one corruption, and are all corrected correctly. The other two codewords (A and F) are beyond the correction ability of ECC2. The two erasures burn one syndrome each, so there are only two syndromes of the original four available for error correction. Error correction requires two syndromes, making the correction limit of the algorithm one error per codeword. Codewords A and F both have two errors. For the purpose of this discussion, assume that the Extended Correction algorithm identifies codeword A as uncorrectable, but mistakenly corrects codeword F. The resulting layout 180 is shown in FIG. 18.

Notice that erased blocks 9 and 10 are mostly regenerated. If a codeword is correct, then the corresponding regions of blocks 9 and 10 are also correct. Similarly, if the codeword is either uncorrectable or incorrectly corrected, the corresponding regions of 9 and 10 reflect this.

The Extended Correction algorithm records the locations of all these codewords into a table. Codeword A goes into the Uncorrectable codewords list, and Codewords B through G go into the Unreliable codewords list. These are all unreliable because there is a relatively high probably of a bad correction, as was the case with codeword F. In fact, in this situation, there is approximately around a 1/16 chance of miscorrection.

After completion, the Extended Correction algorithm checks the EDC of all the bad blocks. The right column on the previous figure shows the bad EDC residuals with X's, and shows the good residuals with empty rectangles. Accordingly, blocks 4 through 8 all have good EDC residuals, and the other blocks have bad residuals. For the purpose of this discussion, one may assume that a subsequent CRC check on blocks 4 through 8 also results in a good (all-zero) residual. This will be true more often than not, unless there is a problem in the CF1 field, or the CRC check-bytes themselves.

At this point, the Extended Correction algorithm has found that 5 blocks (1, 2, 3, 9, 10) have bad EDC/CRC checks. This is more than the limit of 4 blocks allowed by the Iterative Correction algorithm. This makes it necessary to transfer control to the Exhaustive Correction algorithm. The first step of Exhaustive Correction is to attempt an EDC Correction.

This algorithm goes through all the unreliable codewords (which in this case are codewords B through G) and checks whether any of the corrected bytes coincide with a block that now has a good CRC check. The Unreliable Codeword table 190 is illustrated in FIG. 19.

Figure 20:
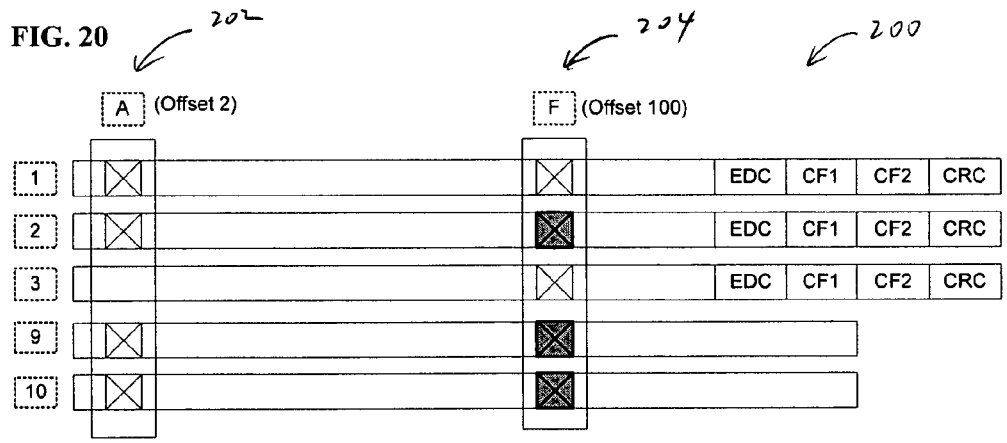
FIG. 20 shows an Entity after removing Reliable Codewords and Good Blocks.

Since blocks 4 through 8 all have good CRC checks, it is possible to promote most of these codewords from Unreliable to Reliable. In fact, the only codeword that remains unreliable is codeword F. A diagram 200 that shows the entities' state after validating unreliable codewords is provided in FIG. 20. Codeword A 202 is uncorrectable, and codeword F 204 is unreliable, as shown in FIG. 20.

Figure 21:
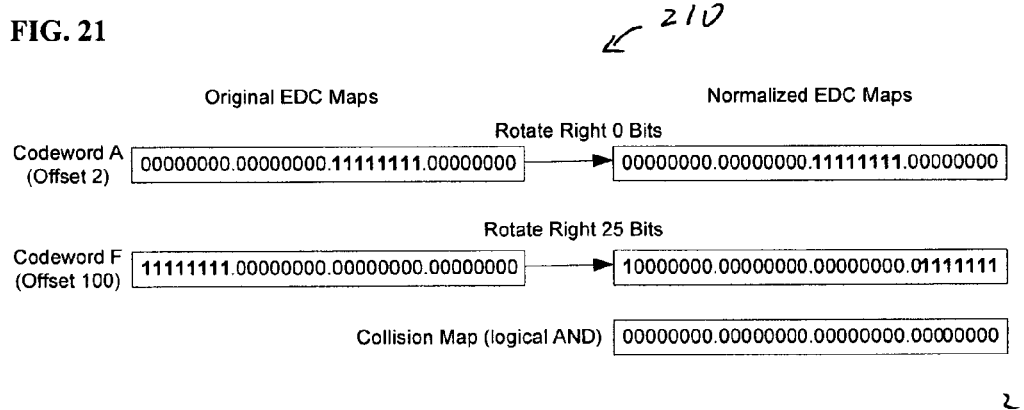
FIG. 21 illustrates the EDC Maps for Codewords A and F.
Figure 22:
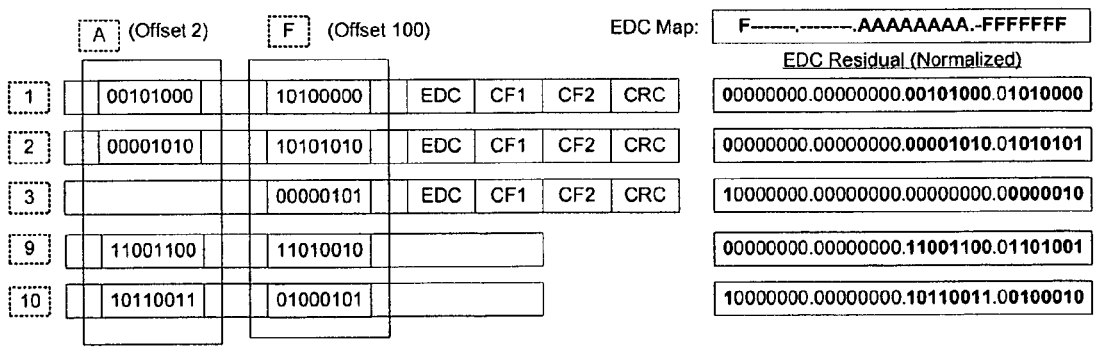
FIG. 22 is an example illustrating Effect of Error Patterns on EDC Residual.

There is about a 53% (17/32) chance that these two codewords affect different parts of the EDC residual (i.e. they don't have a collision in the EDC map). For this example, one can assume that these codewords are independent. Assume that codeword A is at offset 2 and codeword F is at offset 100. The resulting EDC Maps 210 for the codewords are shown in FIG. 21. Note that the resulting Collision Map 212 is zero. This indicates that the two codewords affect independent regions of the EDC residual. One can then reliably apply the EDC residual of each block to the two codewords. In FIG. 22, some sample error patterns are applied to illustrate how these patterns affect the EDC residual 220. All the natural errors in this example have an error pattern of '101', and the other errors are random.

Since which bits within the EDC residual correspond to which codewords have been identified, subsequent correction is a matter of relating these information. One variation of the algorithm is provided below:

1. Loop through all corrupted blocks.
2. Loop through all corrupted codewords within blocks.
3. For current block and codeword, compute the correction word as the logical AND between the EDC Residual and the EDC Map.
4. Update the EDC Residual by removing the bits that match the correction word.
5. Rotate the correction word to the original codeword position.
6. Perform a read-modify-write using an exclusive-OR operation between the correction word and the corrupted word within cache.
7. Continue with all other codewords and blocks.

Figure 23:
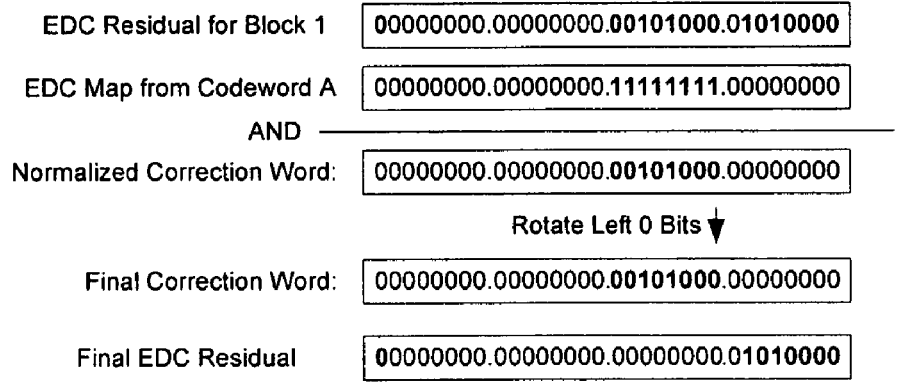
FIG. 23 is an example of Creating Final Correction Word.

As an example, the application of the algorithm 230 on the corruption within Block 1 and Codeword A from FIG. 22 is illustrated in FIG. 23.

The last step is to apply the Final Correction Word to the data within cache by performing an XOR operation to cache. All the zero-bits keep the cache data unchanged, and the one-bits flip the cache data. After performing all the EDC corrections, the final step is to check the CRC on any blocks that now have a good EDC residual (i.e. all-zero). The above example illustrates how the EDC correction algorithm can correct an entity that contains independent codewords, using information from the EDC residual. The next sections describe how to handle cases that have dependent codewords (i.e. non-zero collision maps).

Figure 24:
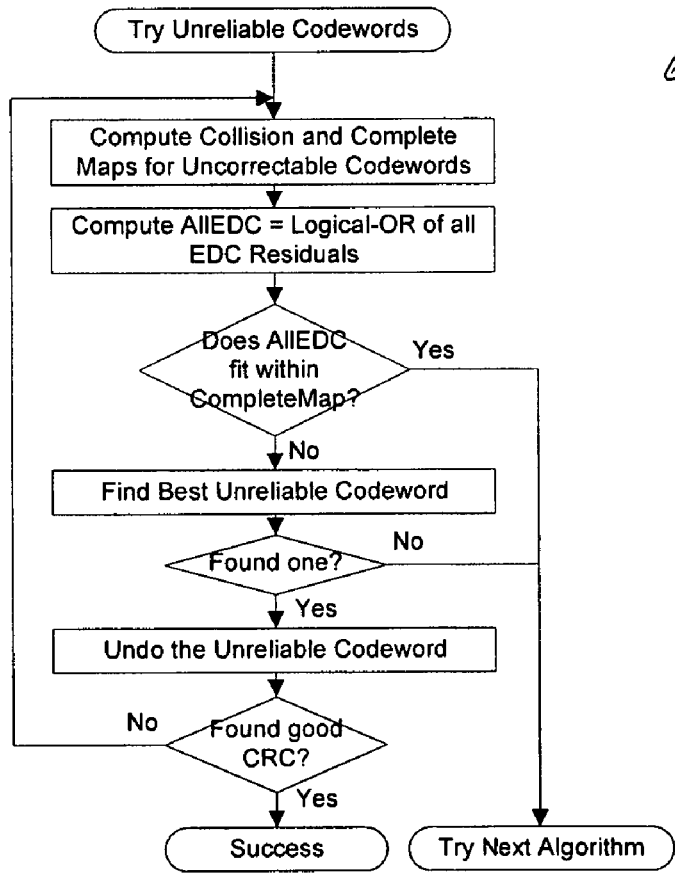
FIG. 24 illustrates an example of an algorithm for Trying Unreliable Codewords.

An algorithm, as shown in FIG. 24, is provided to locate codewords that are likely a miscorrection, and then undo the correction. Frequently, this step produces a block with a good CRC. This algorithm attempts to convert unreliable codewords to uncorrectable codewords, assuming the unreliable correction was a miscorrection. Thereafter, the flow continues to the next algorithm (i.e., Try Uncorrectable Codewords), at which point an attempt is made to convert the uncorrectable codewords back to unreliable codewords. There are situations when it is necessary to attempt these algorithms more than once, so the master flow, FIG. 15, includes these two algorithms twice.

Referring to FIG. 24 the algorithm for trying unreliable codewords is illustrated in detail. One of the functions of the algorithm is to identify the best candidate for a miscorrection. In one variation, there are around 5 to 20 unreliable offsets per block. Most of the corrections will be either one or two bits. This is due to the fact that naturally occurring errors are typically only one bit, which the un-precoder extends out to a 101 pattern. If the defect is close to the end or beginning of a byte, then the second bit will extend outside the byte, leaving a one-bit error.

A miscorrection, on the other hand, is typically a random 8-bit pattern. This is because there is an evenly distributed chance that any of the 8-bit patterns make a valid codeword. Finite fields are capable of generating reasonable pseudo-random numbers, and in this case, the miscorrection is similar to a pseudo-random number.

Figure 25:
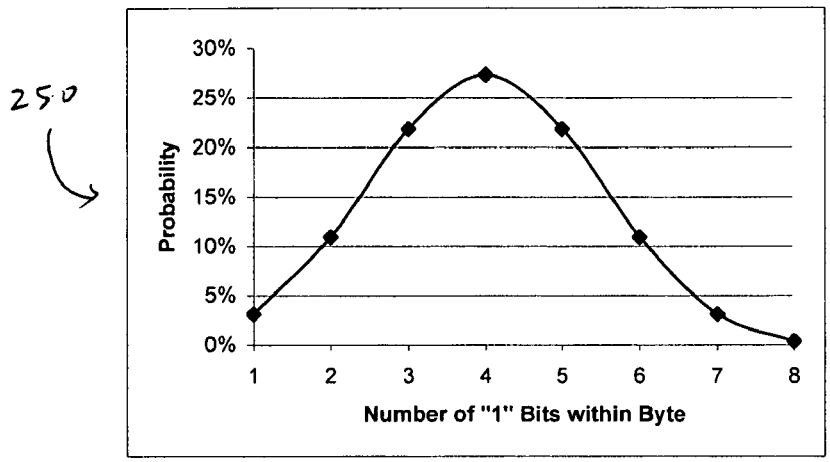
FIG. 25 is diagram illustrating an example of a probability distribution for a given Number of Ones within a Byte.

This algorithm finds the best unreliable codeword by searching for the correction that contains the largest number of binary 1's and that matches the patterns within the EDC residual. FIG. 25 shows the probability 250 of getting a certain number of bits, assuming a uniform random number. As shown in FIG. 25, a random number tends to favor 3, 4, or 5 bits, whereas a natural error tends to favor 1 or 2 bits. By choosing the corrections with a higher number of bits, there is a much higher probability of selecting the miscorrections over the good corrections.

The following section describes the fourth box, Try Uncorrectable Codewords, from FIG. 15. This algorithm is similar to the EDC Correction algorithm, except that it focuses only on the offsets that were previously uncorrectable, excluding the unreliable corrections. If there were no miscorrections in this entity (i.e. all the "unreliable" corrections are reliable), then this algorithm will often be successful. The other condition that may cause problems for this algorithm is when two uncorrectable codewords have colliding corruptions in all the data blocks. In this situation, the EDC has a mixture of two or more codewords, making it impossible to isolate the correct value from any particular codeword.

Figure 26:
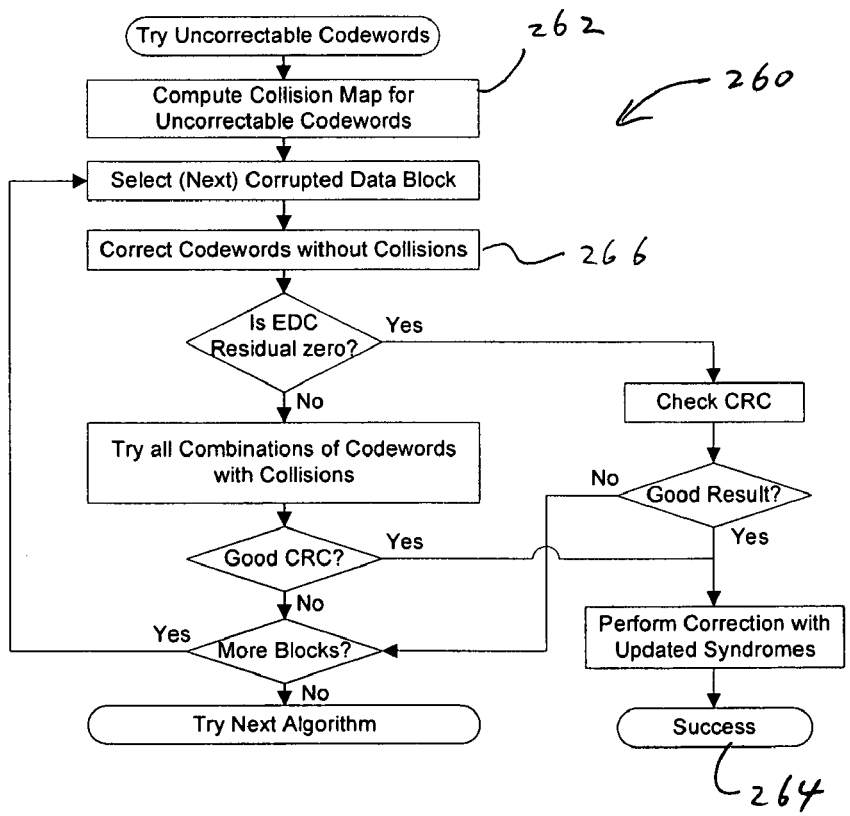
FIG. 26 is an example of an algorithm for Trying Uncorrectable Codewords.

FIG. 26 shows the algorithm 260 for attempting to correct all the (previously) uncorrectable codewords. The first step 262 is to compute the collision map for the uncorrectable codewords. This map is constant for the entire entity, and provides a guide for identifying the nature of each codeword. Next, the algorithm loops through all the data blocks that have bad EDC. For each block, the device tries each of two algorithms: 1) Handle codewords without collisions, and 2) Handle codewords with collisions. If either of these two algorithms finds a block with good CRC, then the algorithm from FIG. 26 returns success 264. The algorithm from FIG. 15 then checks whether the device has enough margin for an iterative correction and continues from the top if the device doesn't have enough margin.

The next two sections discuss the two sub-algorithms from FIG. 26. The first section describes the box labeled "Correct Codewords without Collisions" 266 from FIG. 26. Because there are no collisions, this algorithm has at most 4 codewords to process. This limit is 4 because it is impossible to independently fit more than 4 bytes into a 32-bit EDC residual. It is efficient to process these codewords separately that those with collisions because these codewords do not change value within a block. Conversely, the codewords with collisions have several possible values.

The first step of this algorithm is to use the Collision Map, Complete Map, and EDC Residual to determine whether this algorithm can generate a desired result. One variation of the process is described in detail below:
1. If the EDC residual is zero, and the CRC check failed, then the device cannot handle this block. Go to the next block.
2. Compute the EDC Residual AND NOT Complete Map (i.e. EDC & ~CompleteMap, in C notation). If this result is non-zero, then there are bits within the EDC residual that none of the uncorrectable codewords can affect. In this case, the device skips this entire block. There was a miscorrection in one of the codewords.
3. If the previous check succeeds, the device next looks at whether there are any non-zero bits within the EDC residual that correspond to codewords without collisions. The device can compute this as "EDC Residual AND NOT Collision Map" (i.e. EDC & ~CollisionMap, in C). If this result is zero, then the device skips to the algorithm for handling uncorrectable codewords with collisions. Otherwise, the device continues with this algorithm.

If the previous checks succeed, the device then searches for uncorrectable codewords that affect parts of the EDC residual outside the Collision Map. If the device finds such a codeword, the device corrects the portion of the codeword that does not coincide with the Collision Map. This codeword uses the EDC residual as the error value.

Figure 27:
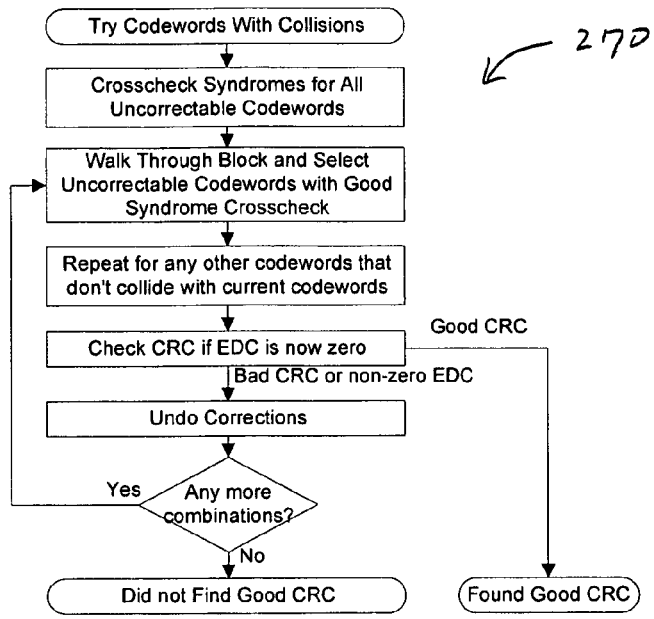
FIG. 27 is an example of an algorithm to Try Uncorrectable Codewords with Collisions.

The second section discusses the algorithm 270 that attempts a correction by exhaustively choosing combinations of uncorrectable codewords with collisions. FIG. 27 outlines the algorithm.

The general concept is to use this algorithm to exhaustively attempt all combinations of dependent uncorrectable codewords. However, if the algorithm were to blindly attempt all combinations, then there could be a very large number of possibilities. This is especially the case in format where there are 3 erasures. In this case, every corruption is uncorrectable, and there are potentially a large number of combinations. An estimate for the largest number of combinations is about $16^4$=64K. If the device does this for each data block, there could be a million different possibilities. This would take several seconds, or even minutes, during which time the device would be more successful with a retry.

Instead of trying every combination, this algorithm restricts itself to the reasonable realm of possibilities. Before attempting any combinations, the algorithm first looks at each codeword and crosschecks the result with the syndromes. If a correction attempt looks reasonable, the device marks the codeword as usable. This crosscheck will remove at least 90% of the wrong choices, and likely 99%.

The equation for modifying the syndromes is as follows:

$$S'_j = S_j + X^j Y \sigma(X)$$

In this equation, $S'_j$ is the jth new syndrome, $S_j$ is the current syndrome, X is the location of the current block, Y is the error pattern from the EDC, and $\sigma(X)$ is the Erasure Location Polynomial, evaluated at X. Variable j is between 0 and (EC-CBlocks−Erasures−1).

After finding all the codewords with good crosschecks, the device can double-check whether these codewords have complete coverage over the non-zero region of the EDC residual. The device determines the coverage by computing the logical-OR of all the EDC maps for these codewords, then performing a logical-AND with the EDC residual. If this result is non-zero, the device doesn't have sufficient coverage to correct this block. In this case, the device skips to the next block.

If the device has complete coverage, the next step is to try all the combinations of independent codewords that leave an all-zero EDC residual. If the EDC residual becomes zero, the device can attempt a CRC check to finally validate this block. A simple recursive algorithm can find these combinations by working through the codewords and selecting new codewords that are independent to the previous codewords.

The following section discusses the 32-bit EDC (Error Detection Code) and how this code can help with entity correction algorithms. The EDC is a 32-bit error detection code that protects the user data region within data blocks. Note that the ECC blocks do not contain a valid EDC field.

The following sections describe the properties of the EDC, the EDC Map, and then cover the EDC correction algorithm. In short, the EDC Map is a way of connecting corrupted codewords to corresponding sections of the EDC residual. It is used in the EDC and Exhaustive Correction algorithms. The computed EDC residual depends only on the error pattern and not on the good data. In addition, the EDC is linear.

The EDC calculations use Galois Field math, similar to the math used by Reed-Solomon codes or CRC checks (or other BCH codes).

The EDC uses 32-bit symbols and is similar to a Reed-Solomon code over $GF(2^{32})$ (A Galois Field with 32 bits). The defining polynomial, P(x), for this field is as follows:

$$P(x) = x^{32} + 1 = (x+1)^{32}$$

A primitive element $\alpha$ in $GF(2^{32})$ shall be $$\alpha = (00000000.00000000.00000000.00000010) \text{ (binary)}$$

Unlike standard Reed-Solomon codes, this code does not use a primitive polynomial for its calculations. In fact, the field size is only 32 elements instead of the full $2^{32}-1$.

This primitive polynomial is very easy to use in hardware and firmware because a multiply by $\alpha$ is equivalent to a left rotate of 1 bit. In fact, multiplying by $\alpha^N$ is the same as a left rotation by N bits (mod 32).

The EDC has a generator polynomial G(x) as follows:

$$G(x) = x + \alpha$$

Figure 28:
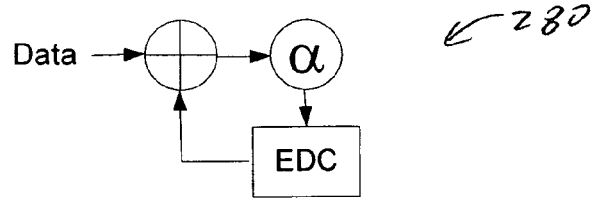
FIG. 28 illustrates an example of an EDC Generator/Checker Circuit.

In this example, the generator polynomial takes on a very simple form. However, the EDC can correct a single 32-bit symbol if another algorithm can determine the error location. This is an important feature used in the Exhaustive Correction algorithm. FIG. 28 is a representation of an EDC generator/checker circuit 280.

In the above diagram, the circle with a plus indicates Galois Field addition, which is equivalent to a bitwise XOR (exclusive-OR) operation. The circle with $\alpha$ shows a Galois Field-multiply operation, which in this case is the same as a 1-bit left-rotate operation. The box labeled 'EDC' is a 32-bit register that holds the EDC residual. Before starting an EDC computation, the hardware (or firmware) initializes the 'EDC' register to all-ones. After initialization, the hardware sequentially feeds all the data into the circuit. In each clock cycle, the hardware processes one 32-bit word of data.

The EDC operation, like Reed-Solomon codes, is linear. This property is useful because it allows us to ignore the good data and focus exclusively on the error pattern. Here is a discussion of how this works.

Let m(x) be the message, or the original data. Let e(x) be the error pattern. Each of these is a polynomial in which the data or error patterns are 32-bit words that are the coefficients of each term within the polynomial. The first 32-bit word is the coefficient of the highest power of x, and the last 32-bit word is the constant term (i.e. the coefficient of $x^0$).

The received data r(x) is the result of adding the message to the error pattern.

$$r(x)=m(x)+e(x)$$

Let EDC(f(x)) be the operation of computing an EDC residual on a data stream f(x). The nature of the EDC computation is such that the following equation holds:

$$EDC(f(x))=f(x) \bmod (x+\alpha)=f(\alpha)$$

This means that the EDC residual is the same as evaluation the input polynomial at $x=\alpha$. If the data is good, then the EDC residual will be zero. That is to say, $$EDC(m(x))=m(\alpha)=0$$

If the device then computes the EDC of the received data, the device gets the following:

$$EDC(r(x))=r(\alpha)=m(\alpha)+e(\alpha)$$

By substituting $m(\alpha)=0$ into $EDC(r(x))=m(\alpha)+e(\alpha)$, the device gets $$EDC(r(x))=e(\alpha)$$

What this means is that the device can ignore the good data and simply focus on the error pattern. That is, any 1s within the EDC residual are a direct result of the error pattern and are independent of the good data.

In this example, the EDC calculation does not depend on whether data is swapped before or after EDC computation. The Policy processor reads data from cache in swapped order. In this context, swapping refers to exchanging the upper 16-bits with the lower 16-bits within a 32-bit data word. There is a computation savings by avoiding a swap on every data word, as opposed to a single swap of the EDC result. Here is an equation that summarizes this property:

$$EDC(SWAP(Data))=SWAP(EDC(Data))$$

This is true because the 16-bit swap operation is equivalent to a left rotate of 16 bits, and Galois Field math is linear. In the EDC's Galois Field, a swap is equivalent to multiplying by $\alpha^{16}$. It is convenient in Galois Field math to represent the user data as a polynomial, with each data point as a coefficient of each term. Here is the equation to represent the data stream m(x), assuming there are N 32-bit words of data:

$$m(x)=D_0 x^{N-1}+\ldots+D_{N-2}x+D_{N-1}$$

where $D_{0 \ldots N-1}$ is the user data stream.

If the device swaps all the data, then the message data looks like this:

$$m_{swap}(x)=\alpha^{16}D_0 x^{N-1}+\alpha^{16}D_1 x^{N-2}+\ldots+\alpha^{16}D_{N-2}x+\alpha^{16}D_{N-1}$$

Galois field math obeys the distributive law, which states that ab+ac=a(b+c). Using this law, the device can collect all the $\alpha^{16}$ factors, as follows:

$$m_{swap}(x)=\alpha^{16}(D_0 x^{N-1}+D_1 x^{N-2}+\ldots+D_{N-2}x+D_{N-1})$$
$$=\alpha^{16}m(x)$$

The EDC residual of the data stream is equivalent to the remainder after dividing m(x) by $(x+\alpha)$. This is equivalent to evaluating $m(\alpha)$. Here is the result of taking the EDC of the swapped data stream:

$$EDC(m_{swap}(x))=m_{swap}(\alpha)=\alpha^{16}m(\alpha)=SWAP(EDC(m(x)))$$

In summary, there is no need to swap each word of the data stream, as long as you swap the EDC residual. Also note that the EDC Maps described below all use a swapped version of the EDC residual, since the swapped residuals are more convenient to the Policy processor. This is applicable because all the maps have a consistent swapped order.

The EDC Map (also called an EDC Mask) is a structure used to map an association between particular codewords and the corresponding region of the EDC residual. This mapping helps to determine whether the EDC residual is trustworthy, and is useful for the Exhaustive correction algorithm. An example illustrating how an Error Affects the EDC Residual is described below. To start with, an example of what the EDC residual looks like with a 1-byte error within the block is discussed below.

Assume that the following error pattern E in the 10th 32-bit word:

$$E=00000000.00000000.00000000.11100111$$

This error pattern represents good data in the first 3 bytes, and corrupt data in the last byte. Because the EDC is linear, the device can completely ignore the good data and focus only on the error pattern. One can assume all the good data equals zero. For instance, assume that there are 100 32-bit words within the EDC-protected region, to determine the resulting EDC residual, the device can imagine computing the EDC only on the single error pattern, and using an all-zero seed. In this example, the first 9 operations would not do anything because the seed is all zero, and the data is all zero. When the device processes the 10th word, the EDC contains the error pattern E. After this point, the EDC calculation continues to process all-zero words. Since the all-zero words don't affect the EDC, the only thing that happens is that the error pattern continues to rotate left 1-bit for every new word. When the device finally gets to the last word, the device has performed 100−10=90 rotations on the EDC value. Since a cyclic rotate of 32-bits gives us the original value, the device needs only look at the number of rotations mod 32 (i.e. the remainder after dividing by 32).

$$\text{Rotations}=90 \bmod 32=26$$

Therefore, the resulting EDC residual is the error pattern E rotated 26 bits to the left. Here is the result:

$$EDC=10011100.00000000.00000000.00000011$$

If the device was able to identify the location of the corrupted byte by another means (such as a failed codeword from Extended Correction), the device could perform a correction by rotating the EDC residual right 26 bits, then XOR-ing this value with the 10th 32-bit word. In fact, this is the concept behind the EDC correction algorithm.

Each byte-wide codeword within an entity only has the ability to alter a specific set of bits within the EDC residual. This is true because the circular rotate operation does not spread-out a pattern across the 32-bit word. Instead, the circular rotate keeps the original bits together and simply changes their position. Because of this property, it is only necessary to determine the region of a 32-bit word possibly affected by a codeword, and the relative entity offset of the codeword.

In the above example, the device knew that the last byte of the 10th word had some kind of corruption. The device doesn't yet know what the error pattern is. The device only identifies that the error affects the bits within the last byte, and does not affect the other three bytes of the word. With this information, the device can create an EDC Mask with the following pattern:

$$\text{Mask}=00000000.00000000.00000000.11111111$$

This mask uses a binary '1' to indicate a bit may depend on the error pattern, and a binary '0' to show that a bit is independent of the error pattern. By this convention, it is possible to find all possible affected bits by performing a logical-OR operation between all the EDC Masks, with the proper rotation.

The EDC Map algorithm rotates all EDC masks and residuals to the neutral position, which, by definition, is the rotation for offset zero. In our example, the device needs to 'normalize' the mask by rotating it to the right by 10 bits because this mask is at word 10. Here is the normalized mask:

Mask=00111111.11000000.00000000.00000000

To compare this Mask to the EDC residual, the device needs to normalize the EDC residual by rotating it right 100 bits, because our previous example placed the EDC in word 100. The 32nd, 64th, and 96th rotate all return the residual to the original position, so the device only needs to shift it right by 100−96=4 bits. Here is what the resulting EDC residual would look like, using EDC=10011100.00000000.00000000.00000011 as an example:

EDC=00111001.11000000.00000000.00000000

Notice that the normalized EDC residual from EDC=00111001.11000000.00000000.00000000 matches up with the Mask from Mask=00111111.11000000.00000000.00000000. This is how the device relates the EDC Mask (or EDC Map) to the EDC residual. The device can relate these normalized versions back to the original versions by performing a left rotate operation by the same number as the previous right rotate.

It is useful to determine whether two or more corrupted codewords could possibly affect the same bits within the EDC residual. If so, then it is possible the two corrupted codewords could cancel each other, leaving them undetected. When this possibility exists, the device can no longer trust the EDC to reliably detect errors, and must switch to a more powerful error detection code, such as the CRC64. Collisions also affect the EDC correction algorithm, because the device then has to resort to multiple combinations of correction attempts, instead of directly applying part of the EDC residual to a specific codeword.

Figure 29:
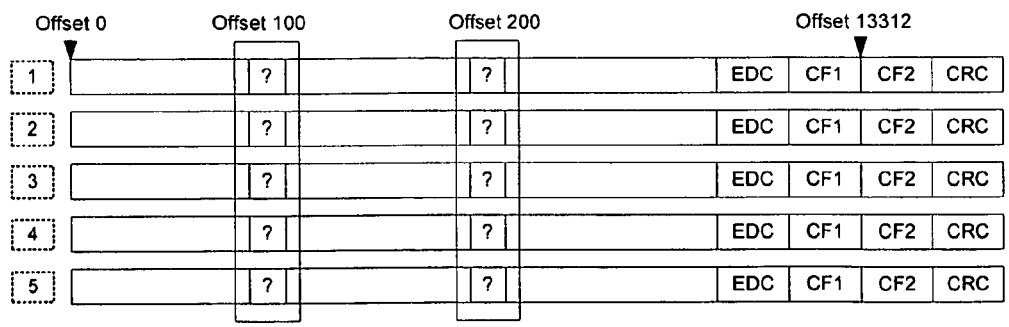
FIG. 29 shows an Entity with Two Unreliable Codewords

For example, an entity just finished Extended Correction, but still has two unreliable (or uncorrectable) codewords. For simplicity, assume that the format is a legacy tape format (i.e., Quantum SDLT600 format) and there are 5 partially recovered blocks and 15 good blocks. The codewords are at byte offsets 100 and 200, respectively. FIG. 29 is a diagram 290 showing the scenario.

In FIG. 29 the '?' represent bytes with unknown quality. They are either the result of an uncorrectable codeword, or the possible result of a codeword with a bad correction. It is difficult to determine which bytes within each codeword are good or bad. All other bytes within the entity are good.

Figure 30:
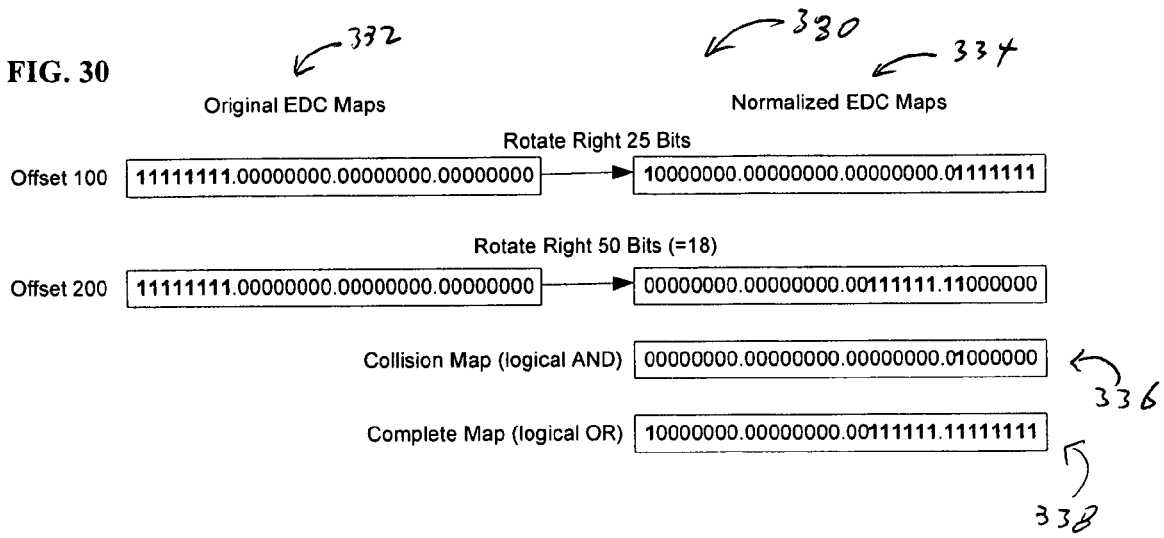
FIG. 30 is an example of creating a collision map.

If these two codewords correspond to different parts of the EDC residual, then it would be possible to use the EDC residual to correct both of these codewords. Additionally, if these codewords are independent, the device could depend on the EDC to identify a corruption. The EDC Maps 300 for both of these codewords are shown in FIG. 30.

For each of the two codewords, the device starts by creating an original EDC map 332. This map depends on the location of the codeword within a 32-bit word. It can either affect byte 0, 1, 2, or 3. In this case, both codewords 100 and 200 affect byte 0 (100 mod 4=0, and 200 mod 4=0). In a Big-Endean system, such as that of SDLT, byte 0 occupies the most significant 8-bits, so both the maps start with ones in the 8 most significant bits. Next, the device normalizes the EDC Maps. This works by rotating the original EDC Map 332 to the right by the word offset. The word offsets of codewords 100 and 200 are respectively 25 and 50. This is due to the fact that there are 4 bytes per 32-bit word (100/4=25 and 200/4=50).

The Collision Map 336 is the overlapping region among all the Normalized EDC Maps 334. In the case of two codewords, this is the logical AND of the two maps. As shown in FIG. 29, the Collision Map 336 is non-zero, having a single one in bit 6. As a consequence, the device cannot trust bit 6 of the EDC residual. It's not a significant collision, but it's enough that the device needs to transition over to a CRC check for block validation. The Complete Map 338 shows all the affected bits within the EDC residual. This is a simple logical OR of all the individual EDC maps. This map is necessary when finding collisions in the general case, when there could be 3 or more unreliable codewords. To find Collisions, the device compares each new Normalized EDC Map to the current Complete Map. If any bits overlap, the device adds them to the collision map.

This invention has been described and specific examples of the invention have been portrayed. While the invention has been described in terms of particular variations and illustrative figures, those of ordinary skill in the art will recognize that the invention is not limited to the variations or figures described. In addition, where methods and steps described above indicate certain events occurring in certain order, those of ordinary skill in the art will recognize that the ordering of certain steps may be modified and that such modifications are in accordance with the variations of the invention. Additionally, certain of the steps may be performed concurrently in a parallel process when possible, as well as performed sequentially as described above. Therefore, to the extent there are variations of the invention, which are within the spirit of the disclosure or equivalent to the inventions found in the claims, it is the intent that this patent will cover those variations as well. Finally, all publications and patent applications cited in this specification are herein incorporated by reference in their entirety as if each individual publication or patent application were specifically and individually put forth herein.

What is claimed is:

1. An error correction device operable to receive a stream of encoded data, which includes a plurality of error detection codes (EDCs), the error correction device comprising:
a decoder operable to use the plurality of EDCs to detect errors in a first dimension of a two dimensional data array derived from the stream of encoded data, and use a Reed-Solomon code to correct codewords in a second dimension of the two dimensional data array, wherein the decoder is further operable to map codewords from the Reed-Solomon code to corresponding bits within at least one of the EDCs, wherein the decoder is operable to generate an EDC map to correlate the codewords from the Reed-Solomon code to EDC residuals, wherein the EDC map consists of binary ones for the bits within the EDC residual that are affected by a changing symbol within the Reed-Solomon codeword, and binary zeros in all the other bits.

2. The error correction device according to claim 1, wherein a symbol size of the Reed-Solomon code is smaller than that of at least one of the EDCs.

3. The error correction device according to claim 2, wherein the data storage medium is selected from a group consisting of optical disk, magnetic disk, optical tape, and magnetic tape.

4. The error correction device according to claim 1, wherein the error correction device is configured as a part of a controller, and the controller is coupled to a transducer for detecting data recorded on a data storage medium.

5. The error correction device according to claim 4, wherein the transducer comprises a magnetic tape drive head, and the data storage medium comprises a magnetic tape.

6. The error correction device according to claim 1, wherein at least one of the EDCs is described by a primitive polynomial having a form g(x)=x$^n$+1, where n is the number of bits within an EDC symbol.

7. The error correction device according to claim 6, wherein a generator polynomial of the EDC has a form G(X)=X+α$^s$ wherein α is a root of the primitive polynomial and s is any integer between 0 and n−1.

8. The error correction device according to claim 1, wherein the EDC map is normalized by performing a cyclic bit-rotation or other mapping operation, such that the bits within a bit-mask directly map to corresponding bits within the EDC residual.

9. The error correction device according to claim 8, wherein two or more EDC maps are generated and a bit-wise logical OR of all the EDC maps is used for determining the bits of the EDC residual affected by all the notable Reed-Solomon codewords.

10. The error correction device according to claim 8, wherein two or more EDC maps are generated and bit-wise logical AND and OR operations are used within the EDC maps to determine whether two or more Reed-Solomon codewords could affect the same bits within the EDC residual.

11. The error correction device according to claim 1, wherein the decoder is operable to use an EDC map, and is further operable to determine an error pattern for a notable Reed-Solomon codeword deemed either non-correctable or unreliably corrected.

12. The error correction device according to claim 1, wherein a second EDC from the plurality of EDCs is used exclusively for error detection and can determine whether corrections from a first EDC from the plurality of EDCs are reliable.

13. The error correction device according to claim 12, wherein the second EDC comprises a cyclic redundancy check (CRC).

14. The error correction device according to claim 12, wherein the second EDC comprises a Reed-Solomon code.

15. A method of data error correction comprising:
using a Reed-Solomon code to identify errors in a plurality of data blocks and attempt to correct the errors;
using cyclic redundancy check to determine whether there are errors in any of the data blocks; and
using an error detection code (EDC) in each data block to correct errors in the data block which are not corrected by the Reed-Solomon code, wherein using an EDC in each data block to correct errors further comprises generating an EDC map, wherein the EDC map identifies the location of the errors within the corresponding data blocks which includes errors that are not corrected by the Reed-Solomon code, wherein generating an EDC map comprises:
creating a set of EDC Maps for each notable Reed-Solomon codeword, the EDC map consisting of binary ones for the bits within the EDC residual that might be are affected by a changing symbol within the Reed-Solomon codeword, and binary zeros in all the other bits; and
normalizing the EDC Maps by performing a mapping operation, such that the bits within the bit-mask directly map to corresponding bits within the EDC residual.

16. The method according to claim 15, wherein the mapping operation comprises a cyclic bit-rotation.

17. The method according to claim 15, wherein at least one of the EDC is described by a primitive polynomial having a form g(x)=x$^n$+1, where n is the number of bits within an EDC symbol.

18. The method according to claim 17, wherein a generator polynomial of the EDC has a form G(X)=X+α$^s$ where α is a root of the primitive polynomial and s is any integer between 0 and n−1.

19. A tape drive operable to perform the method according to claim 15.

20. A magnetic tape drive comprising:
a controller operable to use a Reed-Solomon code to identify errors in a plurality of data blocks and attempt to correct the errors, use cyclic redundancy check to determine whether there are errors in any of the data blocks, and use EDC in each data block to correct errors in the data block which are not corrected by the Reed-Solomon code,
wherein the controller is further operable to generate an EDC map that maps codewords from the Reed-Solomon code to corresponding bits within at least one EDC, wherein the controller is operable to use the EDC map to identify the location of the at least one error within the corresponding data block,
wherein the at least one error is not corrected by the Reed-Solomon code, and the controller is further operable to use the EDC map to correct the at least one error.

21. An error correction device operable to receive a stream of encoded data, which includes a plurality of error detection codes (EDCs), the error correction device comprising:
a decoder operable to use the plurality of EDCs to detect errors in a first dimension of a two dimensional data array derived from the stream of encoded data, and use a Reed-Solomon code to correct codewords in a second dimension of the two dimensional data array, wherein the decoder is further operable to map codewords from the Reed-Solomon code to corresponding bits within at least one of the EDCs,
wherein at least one of the EDCs is described by a primitive polynomial having a form g(x)=x$^n$+1, where n is the number of bits within an EDC symbol.

22. The error correction device according to claim 21, wherein a generator polynomial of the EDC has a form G(X)=X+α$^s$ wherein α is a root of the primitive polynomial and s is any integer between 0 and n−1.

23. An error correction device operable to receive a stream of encoded data, which includes a plurality of error detection codes (EDCs), the error correction device comprising:
a decoder operable to use the plurality of EDCs to detect errors in a first dimension of a two dimensional data array derived from the stream of encoded data, and use a Reed-Solomon code to correct codewords in a second dimension of the two dimensional data array, wherein the decoder is further operable to map codewords from the Reed-Solomon code to corresponding bits within at least one of the EDCs,
wherein the decoder is operable to generate an EDC map to correlate the codewords from the Reed-Solomon code to EDC residuals, wherein the EDC map consists of binary ones for the bits within the EDC residual that are affected by a changing symbol within the Reed-Solomon codeword, and binary zeros in all the other bits.

24. The error correction device according to claim 23, wherein the EDC map is normalized by performing a cyclic bit-rotation or other mapping operation, such that the bits within a bit-mask directly map to corresponding bits within the EDC residual.

25. The error correction device according to claim 24, wherein two or more EDC maps are generated and a bit-wise logical OR of all the EDC maps is used for determining the bits of the EDC residual affected by all the notable Reed-Solomon codewords.

26. The error correction device according to claim 24, wherein two or more EDC maps are generated and bit-wise logical AND and OR operations are used within the EDC maps to determine whether two or more Reed-Solomon codewords could affect the same bits within the EDC residual.

27. A method of data error correction comprising:
using a Reed-Solomon code to identify errors in a plurality of data blocks and attempt to correct the errors;
using cyclic redundancy check to determining whether there are errors in any of the data blocks; and
using an error detection code (EDC) in each data block to correct errors in the data block which are not corrected by the Reed-Solomon code,
wherein using EDC in each data block to correct errors further comprises generating an EDC map, wherein the EDC map identifies the location of the errors within the corresponding data blocks which includes errors that are not corrected by the Reed-Solomon code, and
wherein generating an EDC map comprises:
creating a set of EDC Maps for each notable Reed-Solomon codeword, the EDC map consisting of binary ones for the bits within the EDC residual that are affected by a changing symbol within the Reed-Solomon codeword, and binary zeros in all the other bits; and
normalizing the EDC Maps by performing a mapping operation, such that the bits within the bit-mask directly map to corresponding bits within the EDC residual.

28. The method according to claim 27, wherein the mapping operation comprises a cyclic bit-rotation.

29. The method according to claim 28, wherein at least one of the EDC is described by a primitive polynomial having a form $g(x)=x^n+1$, where n is the number of bits within an EDC symbol.

30. The method according to claim 29, wherein a generator polynomial of the EDC has a form $G(X)=X+\alpha^s$ where $\alpha$ is a root of the primitive polynomial and s is any integer between 0 and n−1.

* * * * *

UNITED STATES PATENT AND TRADEMARK OFFICE
CERTIFICATE OF CORRECTION

| | | |
|---|---|---|
| PATENT NO. | : 7,694,208 B2 | Page 1 of 1 |
| APPLICATION NO. | : 11/313438 | |
| DATED | : April 6, 2010 | |
| INVENTOR(S) | : Matthew V. Ball | |

It is certified that error appears in the above-identified patent and that said Letters Patent is hereby corrected as shown below:

Specification:

In column 1, line 44, delete "plurality error" and insert --plurality of error--.

In column 3, line 14, delete "Map" and insert --Map.--.

In column 3, line 31, delete "Codewords" and insert --Codewords.--.

In column 3, line 67, delete "from storage" and insert --from a storage--.

In column 4, line 11, delete "but not" and insert --but is not--.

In column 4, line 26, delete "18, the" and insert --18. The--.

In column 4, line 27, delete "each of data" and insert --each data--.

In column 4, line 30, delete "block" and insert --blocks--.

In column 4, line 38, delete "occupies" and insert --occupy--.

In column 4, line 61, delete "using the" and insert --using a--.

Signed and Sealed this

Twenty-second Day of June, 2010

David J. Kappos
*Director of the United States Patent and Trademark Office*